US009071038B2

(12) United States Patent
Evans et al.

(10) Patent No.: US 9,071,038 B2
(45) Date of Patent: Jun. 30, 2015

(54) SEGMENTED DISTRIBUTED FEEDBACK LASER

(75) Inventors: Peter W. Evans, Mountain House, CA (US); Scott Corzine, Sunnyvale, CA (US)

(73) Assignee: Infinera Corporation, Sunnyvale, CA (US)

( * ) Notice: Subject to any disclaimer, the term of this patent is extended or adjusted under 35 U.S.C. 154(b) by 678 days.

(21) Appl. No.: 12/751,900

(22) Filed: Mar. 31, 2010

(65) Prior Publication Data

US 2011/0243175 A1 Oct. 6, 2011

(51) Int. Cl.
*H01S 5/12* (2006.01)
*H01S 5/10* (2006.01)

(52) U.S. Cl.
CPC .............. *H01S 5/1209* (2013.01); *H01S 5/12* (2013.01); *H01S 5/1206* (2013.01); *H01S 5/1039* (2013.01); *H01S 5/1215* (2013.01)

(58) Field of Classification Search
CPC ... H01S 5/06256; H01S 5/06258; H01S 5/12; H01S 5/1206; H01S 5/1215; H01S 5/125
USPC .................................................. 372/102, 96
See application file for complete search history.

(56) References Cited

U.S. PATENT DOCUMENTS

| | | | | |
|---|---|---|---|---|
| 4,958,357 A | * | 9/1990 | Kinoshita | 372/96 |
| 5,960,023 A | * | 9/1999 | Takahashi | 372/96 |
| 6,638,773 B1 | * | 10/2003 | Hwang et al. | 438/2 |
| 2004/0125845 A1 | * | 7/2004 | Park et al. | 372/50 |
| 2008/0192794 A1 | * | 8/2008 | Hammer | 372/96 |

* cited by examiner

*Primary Examiner* — Armando Rodriguez
(74) *Attorney, Agent, or Firm* — Ross M. Carothers; David L. Soltz (57) ABSTRACT

The present invention provides for a semiconductor laser having a narrow linewidth and low power consumption for optical communication applications. According to various embodiments of the invention, a semiconductor laser is provided which includes a grating layer comprising a plurality of segmented gratings, each including a non-grating portion and a grating portion. The segmented gratings are configured to enhance a fundamental mode of the semiconductor laser while sufficiently suppressing modes other than the fundamental mode, providing a narrow linewidth for example. The segmented gratings are also configured to provide an effective length longer than an actual length of the semiconductor laser, leading to smaller device areas and corresponding lower power consumption. A photonic integrated circuit is also provided which includes a plurality of semiconductor lasers, consistent with the present invention, as well as additional optical elements, all provided on a single substrate.

7 Claims, 11 Drawing Sheets

SEGMENTED DISTRIBUTED FEEDBACK LASER

BACKGROUND OF THE INVENTION

1. Field of the Invention

This invention relates generally to semiconductor lasers and, more particularly, to grating structures within semiconductor lasers.

2. Description of the Related Art

The use of compact photonic integrated circuits (PICs) has become widespread as the need for long-distance high-speed telecommunication systems has grown. Such long-distance systems, e.g. having optical fiber spans greater than 80 km, are limited in capacity by the optical channel spacing of carrier wavelengths and by the modulation format utilized. On-Off keying (OOK) modulation formats, for example, interact strongly with optical fiber nonlinearities to be useful at high data rates and close channel spacings. Accordingly, to maximize system throughput, phase modulation formats, such as differential quadrature phase shift keying (DQPSK) or differential phase shift keying (DPSK) for example, or polarization multiplexed versions of such formats, such as polarization multiplexed differential quadrature phase-shift keying (PM DQPSK) and polarization multiplexed differential phase-shift keying (PM DPSK), respectively, are often utilized with a channel spacing of 50 GHz, 25 GHz or less. However, to transmit and receive sufficiently error-free data under these conditions, a sufficiently narrow linewidth laser source is often used. For example, a laser source having a strong output at the fundamental mode, the lowest order mode resonant with the overall grating structure for example, while concurrently suppressing modes other than the fundamental mode is highly desirable. Laser sources utilized as local oscillators in coherent systems also may benefit from having a narrow linewidth, as compared to other conventional laser sources for example. In coherent systems the optical signal of the laser source, e.g. the local oscillator, is compared with an incoming signal to demodulate the data carried by the incoming stream.

To date, four basic types of lasers suitable for such high-speed applications utilizing phase modulation formats include: external feedback lasers; distributed feedback (DFB) lasers; distributed Bragg reflector (DBR) lasers; and discrete-mode Fabry-Perot or photonic bandgap lasers. While all of these laser sources offer significant attributes, each has one or more deficiencies which make them non-ideal for large-scale photonic integration, such as part of PIC device for example. For example, external-feedback lasers, by design, are incapable of monolithic integration. DFB lasers must be excessively large to achieve narrow linewidth, and thus consume large amounts of power and require a correspondingly large area of the integrated circuit, area which could be used for other components or for additional devices as part of a fabricated wafer to increase overall yield. Additionally, such long DFB lasers result in an exponential increase in energy at the center of the laser cavity resulting in spatial hole burning and gain loss with respect to the fundamental mode of the laser if the grating coupling strength is not adjusted. DBR lasers are susceptible to mode-hopping, for example jumping from one longitudinal mode to another due to operating conditions such as temperature, and require complex tuning algorithms with 3 or more sections contacted to have stable operation over life. Photonic bandgap lasers fabricated to date require cleaves and/or suffer from unpredictable yield, and therefore are unsuitable for large-scale photonic integration.

In designing suitable lasers having adequate power for high-speed optical transmission utilizing more advanced phase-shift modulation formats, a length of the laser cavity and a coupling coefficient κ of the grating must be considered. For example, in a DFB laser, characteristics of the optical output significantly change with respect to κL, representing the product of the coupling coefficient κ and the length L of the laser. Thus, in order to maintain a desired ratio between the output power and peak power of the laser while increasing the length of the laser, the coupling coefficient κ must be reduced accordingly.

What is needed is a semiconductor laser which is compact, offers narrow linewidth, low power consumption, and high yield, the semiconductor laser being suited for high-speed transmission of data utilizing phase modulation formats for example. It is also desirable for such a semiconductor laser to have reduced complexity, having a single contacted section spanning the entire laser for example. Also, what is needed is a semiconductor laser structure which provides for a reduced κ to maintain a desired ratio between the output power and the peak power of the laser. Further, what is needed is a photonic integrated circuit incorporating a plurality of such semiconductor lasers on a single substrate.

SUMMARY OF THE INVENTION

The present invention provides a system, apparatus and method of fabricating a semiconductor laser having a narrow linewidth and low power consumption. Such a laser system is especially useful in systems which employ phase-shift modulation schemes, such as PM DPSK and PM DQPSK for example. According to various embodiments of the invention, a grating layer is provided which includes first and second gratings, the first grating provided at a first end of the grating layer and the second grating provided at a second end of the grating layer, and a segmented grating. The segmented grating is positioned between the first and second gratings along a longitudinal axis of the grating layer, the segmented grating having a length extending from an edge of the first grating to an edge of the second grating, for example. The segmented grating has a coupling coefficient value, averaged over the length of the segmented grating for example, which is greater than zero, but less than coupling coefficients of the first and second gratings, respectively. In additional embodiments of the invention, the segmented grating includes a plurality of grating portions, each spaced from adjacent ones of the plurality of third gratings. In some embodiments, for example, a first group of the plurality of third gratings may be spaced from a second group of the plurality of third gratings. The lengths of the various spacings may be related to an operating wavelength of a corresponding laser including the grating layer.

Consistent with other various embodiments of the invention, a semiconductor laser is provided which includes a substrate, and a grating layer provided on the first cladding layer. The grating layer includes first and second gratings and first and second pluralities of segmented gratings, each of the first and second plurality of segmented gratings including a non-grating portion and a grating portion. The first plurality of segmented gratings are spaced from the second plurality of segmented gratings along a longitudinal axis of the grating layer to define a cavity. In some embodiments, a length of the cavity may be different than a length of each non-grating portion of each of the first and second pluralities of segmented gratings.

Still other embodiments consistent with the present invention comprise a photonic integrated circuit including a plurality of laser sources, each including a grating layer consistent with the present disclosure. In other embodiments of the invention, the photonic integrated circuit may include a plurality of modulators, each configured to receive an optical signal from a corresponding one of the plurality of laser sources and provide a corresponding modulated output. The modulated outputs of each of the plurality of modulators may include first and second modulated outputs. In still other embodiments, the photonic integrated circuit includes a multiplexer, such as a polarization multiplexer for example, the multiplexer configured to receive the modulated outputs from each of the plurality of modulators and provide a wavelength-division multiplexed signal, for transmission over a network infrastructure for example. In certain embodiments, the multiplexer is a polarization multiplexer and the wavelength-division multiplexed signal is a wavelength-division polarization multiplexed signal.

Other objects, features and advantages of the invention will be apparent from the drawings, and from the detailed description that follows below.

BRIEF DESCRIPTION OF THE DRAWINGS

Reference will be made to embodiments of the invention, examples of which may be illustrated in the accompanying figures. These figures are intended to be illustrative, not limiting. Although the invention is generally described in the context of these embodiments, it should be understood that it is not intended to limit the scope of the invention to these particular embodiments. In the drawings wherein like reference symbols refer to like parts.

DETAILED DESCRIPTION OF THE INVENTION

The present invention provides a system, apparatus and method to provide a semiconductor laser having a narrow linewidth and low power consumption for optical communication applications. According to various embodiments of the invention, the semiconductor laser preferably includes a grating layer comprising a plurality of segmented gratings, each including a non-grating portion and a grating portion. The segmented gratings are configured to enhance a fundamental mode of the semiconductor laser while sufficiently suppressing modes other than the fundamental mode, such that a relatively narrow linewidth more suited for high-speed data transmission in an optical communication network can be achieved, for example. The segmented gratings are also configured to provide a longer effective length of a semiconductor laser, which allows for smaller device areas and corresponding lower power consumption, as well as overall higher yields. For purposes herein, the effective length of the laser may be defined in any suitable manner. For example, the effective length of the laser may be defined relative to the electric field (E-field) intensity envelope within the laser cavity. In such a case, the effective length of the laser may be defined as the width of the envelope at a location where a line, which runs parallel to the length of the laser, bisects the envelop such that half of the area of the envelope is above the line and half of the area of the envelope is below the line. The plurality of segmented gratings of the present invention, for example, may employ multiple non-grating portions which are in-phase with remaining portions of the plurality of segmented gratings with respect to the fundamental mode of the corresponding laser, providing a laser having a longer effective length. The overall length of the laser source of the present invention may be substantially less than that of a conventional DFB laser for example, and may have lower power consumption and yet comparable optical output power. Stating it another way, to achieve the same optical output power and linewidth as the present invention, a conventional DFB would require a longer physical length.

The following description is set forth for purpose of explanation in order to provide an understanding of the invention. However, it is apparent that one skilled in the art will recognize that embodiments of the present invention, some of which are described below, may be incorporated into a number of different systems and devices.

Structures and devices shown below in block diagram are illustrative of exemplary embodiments of the invention and are meant to avoid obscuring the invention. Furthermore, connections between components within the figures are not intended to be limited to direct connections. Rather, data between these components may be modified, re-formatted or otherwise changed by intermediary components.

Figure 1:
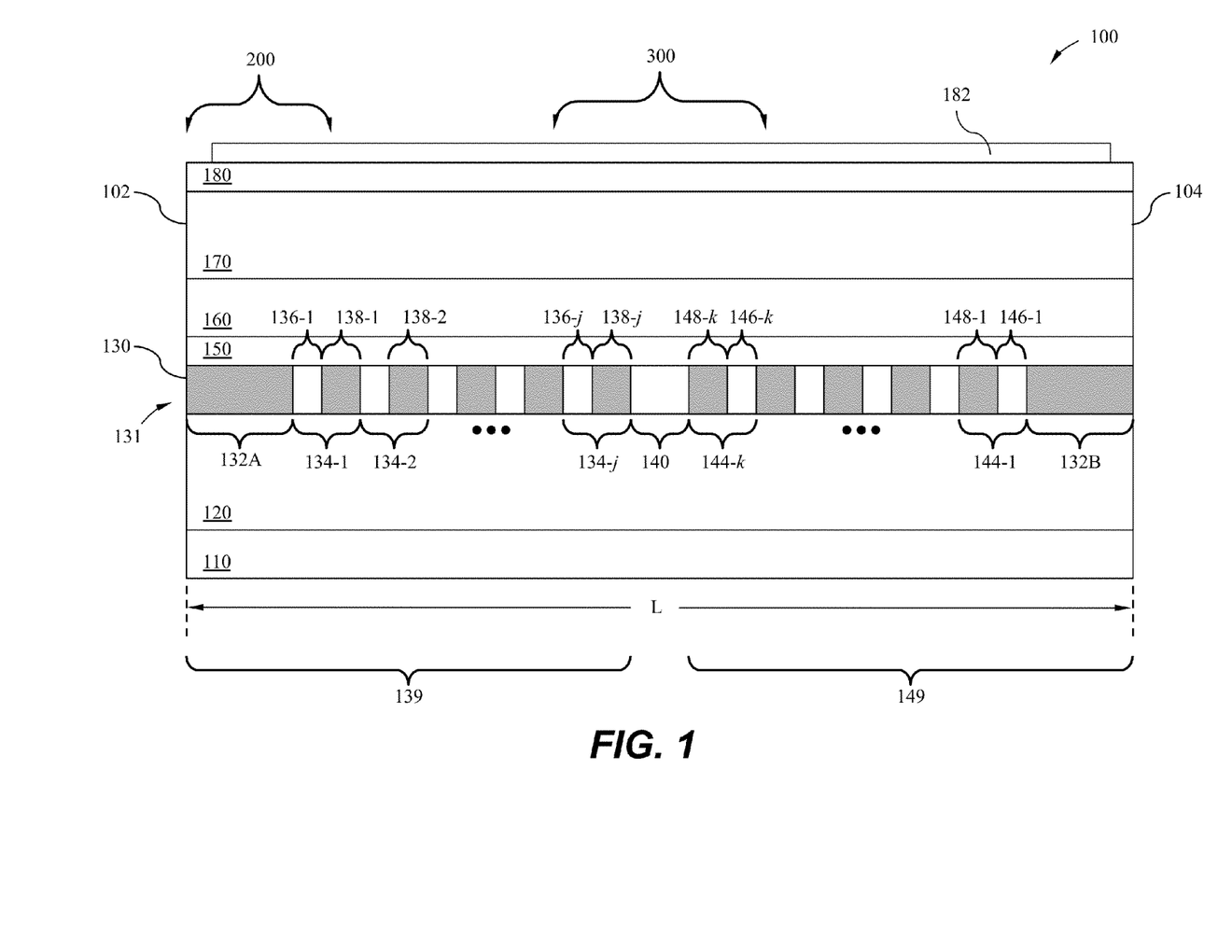
FIG. 1 is a cross-sectional view of a semiconductor laser, according to certain aspects of the present invention.

FIG. 1 illustrates a cross-section view of an exemplary semiconductor laser 100, according to certain aspects of the present invention. The depiction of the semiconductor laser 100 is for illustration purposes only and is not intended to represent an actual scale depiction of the structure of the semiconductor laser 100. As shown, the semiconductor laser or laser 100 is a multi-layer semiconductor device having a length L extending from a first end 102 to a second end 104. As is discussed in more detail below, the semiconductor laser 100 may be part of a larger photonic integrated circuit including additional various active and passive elements including, but not limited to, modulators, variable optical attenuators, semiconductor optical amplifiers, photodiodes, polarization rotators, polarization multiplexers, polarization beam combiners and splitters, waveguides, wavelength selective combiners, and power combiners. One exemplary grouping of semiconductor layers which may be present in the semiconductor laser 100 of FIG. 1 includes a substrate 110, a first cladding layer 120, a grating layer 130, a second cladding layer 150, an active layer 160, a third cladding layer 170, a contact layer 180, and a metallic contact 182.

As depicted in FIG. 1, the grating layer 130 includes a segmented grating 131. As used herein, a "segmented grating" refers to a structure which includes one or more grating structures (as shown in shaded form in FIG. 1 for example) adjacent to one or more voids or non-grating structures, e.g. areas devoid of grating structures, along a longitudinal axis of the grating layer. Additionally, the term "void" or "cavity" as used herein with respect to such non-grating structures does not necessarily mean the area is devoid of matter, e.g. semiconductor material. Rather, "void" or "cavity" as used herein with respect to such non-grating structures refers to portions of the grating layer which do not include specific grating structures, e.g. alternating portions of high-index and low-index materials, each alternating portion having a length substantially equal to a quarter-wavelength of a desired optical output of a semiconductor laser. Such non-grating structures are actively pumped and, thus, provide gain. Such provided gain, as described in greater detail below, is in-phase with the remainder of the non-grating structures. Additional details regarding the grating and non-grating portions or structures of the grating layer are discussed below with respect to FIGS. 2 and 3.

As shown in FIG. 1, the segmented grating 131 may comprise a first grating 132A and a second grating 132B near first and second ends 102, 104 of the semiconductor laser 100, respectively. The segmented grating 131 may further comprise a plurality of j segmented gratings or grating portions 134-1 through 134-j, collectively referred to as grating portions 134, adjacent the refractive grating 132A. Segmented grating 131 may further comprise a plurality of k segmented grating portions 144-1 through 144-k, collectively referred to as grating portions 144, adjacent the refractive grating 132B. It should be noted, consistent with the definition above, the segmented gratings 134, 144 may collectively be referred to as a segmented grating. Furthermore, the two end grating portions 132A, 132B, along with the segmented grating portions 134, 144, may collectively be referred to as a segmented grating.

Figure 2:
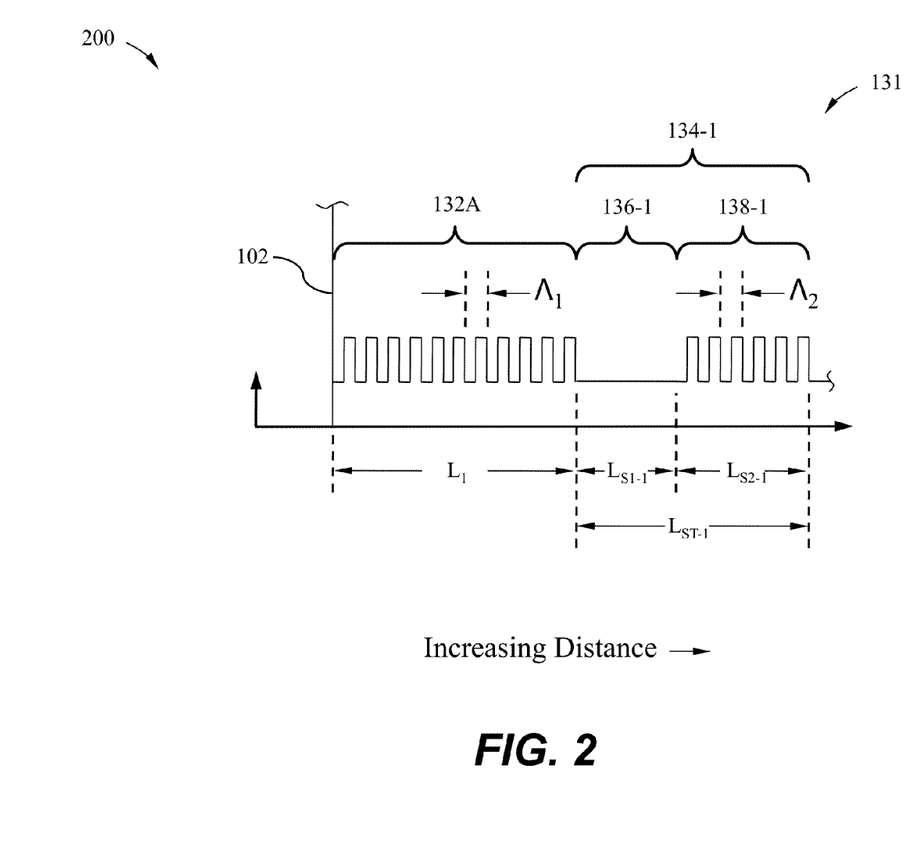
FIG. 2 is a flow chart depicting a method of fabricating a semiconductor laser, according to certain aspects of the present invention.

Each of the plurality of j segmented grating portions 134 may include a void or non-grating portion 136 and a grating portion 138. For example, segmented grating portion 134-1 includes a non-grating portion 136-1 and a grating portion 138-1. Similarly, each of the plurality of k segmented grating portions 144 may include a void or non-grating portion 146 and a grating portion 148. For example, segmented grating portion 144-1 includes a non-grating portion 146-1 and a grating portion 148-1. As shown in FIG. 1, although the individual lengths of each grating portion 132A, 132B and segmented grating portions 134-j, 134-k may be different, a first segmented grating 139 defined by grating portion 132A and segmented grating portions 134-j and a second segmented grating 149 defined by grating portion 132B and segmented grating portions 134-k may form a structural mirror image of each other. The first and second segmented gratings 139, 149 are spaced along the longitudinal axis of the grating layer by a void or non-grating portion 140, also referred to herein as cavity 140. It should be noted that while a finite number of segmented portions 134, 144 are depicted, more or less such portions 134, 144 may be utilized. Additionally, the number of segmented portions 134 may differ from the number of segmented portions 144. Thus, while shown as being centered with respect to the grating layer, the non-grating portion 140 may be provided along any length of the grating layer as long as the in-phase nature of the segmented grating 131 structure is maintained, as is discussed further below. FIG. 2 details a first portion 200 of the segmented grating 131, the first portion 200 generally including the grating 132A and the first segmented grating 134-1 of j segmented gratings 134, as part of semiconductor laser 100, as indicated by the bracket labeled 200 in FIG. 1.

Turning to FIG. 2, the structure of a first portion 200 of the segmented grating 131 structure of laser 100 will be discussed in greater detail. The discussion relative to the first portion 200 including grating portion 132A and segmented grating 134-1 is equally applicable to grating portion 132B and segmented grating portions 144-1, respectively. Additionally, the discussion regarding 134-1 is applicable to all segmented gratings 134, as well as all segmented gratings 144. It is noted that FIG. 2 is not intended to be a scale depiction of the grating portion 132A relative the segmented grating 134-1.

As discussed above, the first segmented grating 139, for example as part of the larger segmented grating 131, includes the grating portion 132A and one or more segmented grating portions 134. The grating portion 132A is formed to have a grading pitch or period of $\Lambda_1$, as well as a length $L_1$ extending from the first end 102 of the laser 100, as shown in FIG. 2. The grating 132A length $L_1$ is selected to provide sufficient feedback to support lasing at relatively high inversion at a fundamental mode of the corresponding laser, defined by the period $\Lambda_1$. The length $L_1$, for example, can be in the range from 10-45% of the total length L of the grating layer 130 of the laser 100. The segmented grating portion 134-1 has a total length $L_{ST-1}$ and includes the void or non-grating portion 136-1 having a length $L_{S1-1}$ and a grating portion 138-1 having a length $L_{S2-1}$.

The non-grating portions 136 are provided at various points along the segmented grating 131 to effectively lower the coupling coefficient, κ, in the central portion of the segmented grating 131, that portion extending from the first grating portion 132A to the second grating portion 132B. By lowering the coupling coefficient in the central portion of the segmented grating 131, the overall length of the laser 100 can be increased to provide additional output power, while maintaining a desired power ratio of output power to peak power. Without such non-grating portions 136, for example in a conventional DFB laser, an increase in length of the laser would result in an undesirable exponential increase in peak power, which may lead to spatial hole burning and, ultimately, to gain loss with respect to the fundamental mode. Thus, for a given desired κL, the length L of the laser can be increased and segmented gratings 134, 144 can be positioned along the segmented grating 131 to reduce κ in those areas, providing a reduced overall κ, e.g. averaged over the segmented grating 131 structure, compensating for the increased length L. Additionally, since the coupling coefficient of the first grating portion 132A is stronger than the coupling coefficient associated with the segmented gratings 134, due to the non-grating portions 136, the segmented grating 131 structure provides for an increase in the effective cavity length of the laser in defining the quality factor (Q), linewidth and side-mode suppression ratio (SMSR) of the laser 100 segmented grating 131. The length $L_{S1-1}$ of the non-grating portion 136-1 is preferably shorter when compared to the length $L_1$ of the grating portion 132A, thus preserving the fundamental mode of the laser 100, primarily defined by grating portion 132A (as well as 132B), while limiting the presence of undesirable modes, for example modes other than the fundamental mode.

More specifically, the non-grating portion 136-1 is sufficiently short such that non-fundamental modes enhanced by the non-grating portion 136-1 are sufficiently far from the fundamental mode of the segmented grating 131 such that insufficient gain is available relative to these micro-cavity or non-fundamental modes. The corresponding grating portion 138-1, which has a periodicity of $\Lambda_2$, where $\Lambda_2$ is substantially equal to $\Lambda_1$, would then detune the non-fundamental modes of the non-grating portion 136-1 from other structures in the segmented grating 131. As one of ordinary skill in the art can appreciate, when the number of segmented portions 134 decreases and/or the length $L_{S2-1}$ of the non-grating portions 136 of the segmented portions 134 increases, for example to approach the length $L_1$ of grating portion 132A, the segmented laser 100 would operate more like a conventional DFB laser. Thus, the number of segmented portions 134 and corresponding lengths $L_{S2-j}$ of each of the non-grating portions 136 must be carefully selected, as discussed in greater detail below with reference to FIGS. 6 and 7.

The length $L_{S2-1}$ of grating portion 138-1 may be a higher or lower percentage of the length $L_{ST-1}$ of the grating portion 134-1, if desired. However, for a fixed segmented grating length L, if the length $L_{S2-1}$ of the grating portions 138 is too high of a percentage of the length $L_{ST-1}$ of corresponding grating portions 134, the coupling coefficient averaged over the segmented grating 131 would increase which may lead to an undesirable increase in peak power of the laser. Alternatively, for a fixed segmented grating 131 length L, if the length $L_{S2-1}$ of the grating portions 138 is too low of a percentage of the length $L_{ST-1}$ of corresponding grating portions 134, the coupling coefficient averaged over the segmented grating 131 would decrease which may lead to the presence of undesirable side-modes. Additionally, individual respective lengths $L_1$, $L_{S1-1}$, $L_{S2-1}$ of the grating portion 132A, the non-grating portions 136, and the grating portions 138 are designed to be multiples of a quarter-wavelength consistent with the fundamental mode of the laser 100. Stated differently, the individual lengths $L_1$, $L_{S1-1}$, $L_{S2-1}$ cooperate such that a resonant condition occurs for a single wavelength that is in-phase with the grating and non-grating structures of the segmented grating 131, consistent with the fundamental mode of the laser 100.

Figure 3:
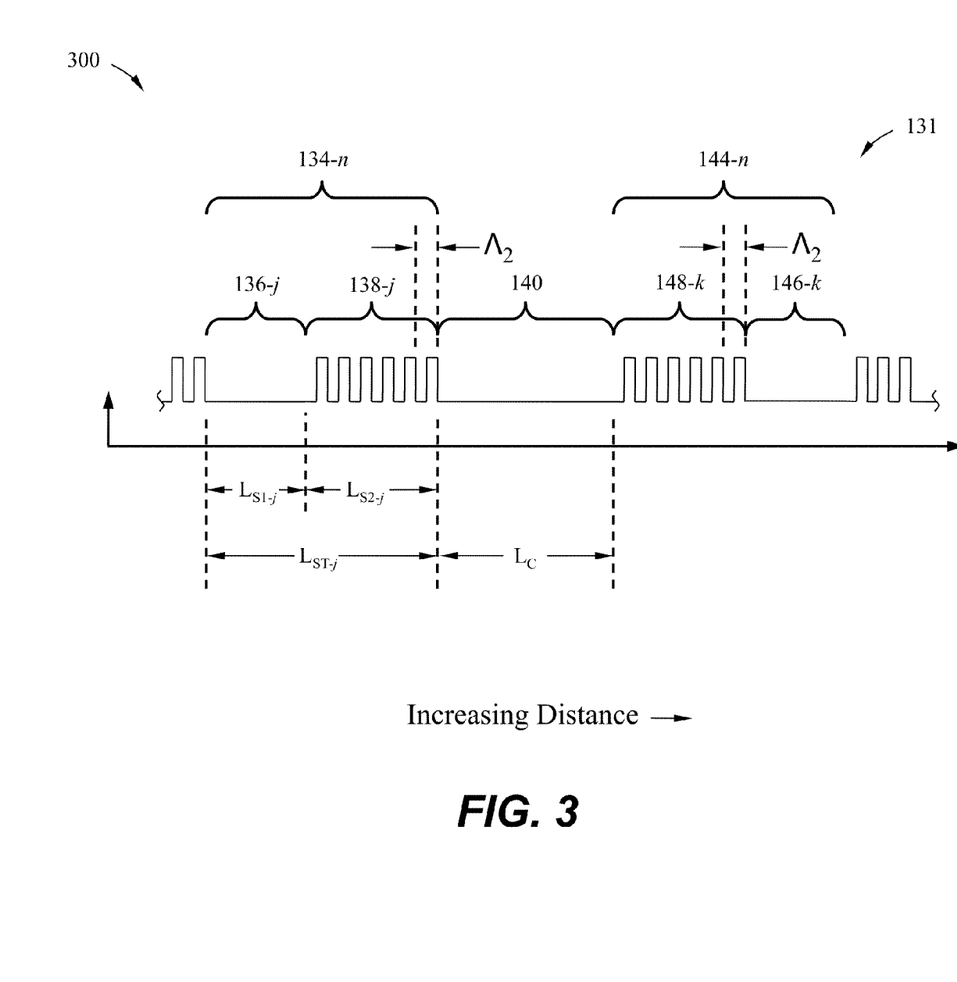
FIG. 3 is a detailed depiction of a first portion of the semiconductor laser of FIG. 1.

Turning also to FIG. 3, a second portion 300 of the segmented grating 131 of the semiconductor laser 100 will be discussed. The discussion above regarding segmented portion 134-1 applies equally to segmented portions 138-j and 148-k of the second portion 300. As mentioned above, the structural layout of the first segmented portion 139 and the second segmented portion 149 may be mirror images of each other, spaced from each other to define a void or non-grating portion 140 therebetween, having a length $L_c$. It is noted that while these structural layouts are mirror images, the actual lengths of each segmented portion 134, 144 and each non-grating portion 136 and grating portion 138 thereof, as well as the end grating portions 132A, 132B, may be different, as long as the in-phase nature of the physical structure is maintained along the longitudinal axis of the segmented grating 131 to enhance the fundamental mode.

For illustration purposes only, with grating portions having a 50% duty cycle relative to the ratio of high-index to low-index material and the fundamental mode is established by the periods $\Lambda_1$ of the main end grating portions 132A, 132B, respectively, and the resulting frequency of the laser 100 is defined as $\lambda_0 = 2 * \Lambda_1 * n_{eff}$, where $n_{eff}$ is the effective index of the structure. When describing the individual lengths of the various structures in the laser, such as the grating portions 132A, 132B, the non-grating portions 136, 146 and grating portions 138, 148 of the segmented grating portions 134, 144, and the cavity 140 for example, it is also convenient to define the wavelength in the laser, $\lambda = \lambda_o / n_{eff}$. Accordingly, the in-phase nature of the segmented grating 131 may be maintained if the non-grating portions 136, 146 of each of the segmented grating portions 134, 144 has a length $L_{S1-j}$, $L_{S1-k}$ given by:

$$\frac{\lambda x}{4}$$

where x is an odd number greater than 1. As mentioned above, these non-grating portions 136, 146 effectively lengthen the laser cavity and ensure that non-resonant modes, e.g. modes other than the fundamental mode that would normally form between the end grating portions 132A, 132B have less Q. These modes other than the fundamental mode cause large phase errors in the odd-$\lambda/4$ non-grating portions 136, 146 which act to detune adjacent grating portions 138, 148 from each other, the grating portions 138, 148 having a duty cycle of 50% of high-index to low-index material, for example. Thus, with the grating periodicity related to the wavelength of the laser 100 by the factor of $\lambda/2$ and a duty cycle of 50%, each index portion of the grating, e.g. the high-index portion and the low-index portion, has a length of $\lambda/4$ along the axis of the segmented grating 131 structure. It is found that the center cavity portion 140, in order to maintain the in-phase nature of the segmented grating 131 structure, must have the length $L_c$ given by:

$$\frac{\lambda z}{4}$$

where z is an even number. While this value of z is a useful guide, the optimum value of z may be slightly different, a non-integer for example, to account for spatial hole burning, non-uniform temperature along the length of the cavity or other reasons to maintain the stability of the fundamental lasing mode. Thus, the length of the non-grating portion 140 will differ from the length of each non-grating portion 136, 144 by about a quarter-wavelength of the laser, e.g. $\lambda/4$.

This illustration is based upon each portion of either high-index or low-index material of the gratings used in the segmented grating 131, such as the various grating portions 132A, 132B, 138, 148, having a length of $\lambda/4$, but this is one of many different possible solutions. As is well known in the art, the period of the reflective structure, e.g. the various grating portions 132A, 132B, 138, 148, by design must be approximately $\lambda/2$, where $\lambda = \lambda_o / n_{eff}$, and $\lambda_o$ is the wavelength of the laser, e.g. corresponding to the fundamental mode of the laser. As long as the grating period is maintained with the appropriate phase adjustment between sections, any reasonable duty cycle may be used for the various grating portions. In its simplest form, a duty cycle of 50% can be used, as described above, such that each alternating high-index material and low-index material of each grating portion, has a length of $\lambda/4$ along the longitudinal axis of the segmented grating 131. However, it should be noted one could fulfill the $\lambda/2$ design requirement by providing alternating high-index and low-index material having lengths which provide for different duty cycles. For example, the various grating portions could be formed of high-index material having a length of $\lambda/8$ and low-index material having a length of $3\lambda/8$ or high-index material having a length of $3\lambda/16$ and low-index material having a length of $5\lambda/16$, or high-index material having a length of $0.24\lambda$ and low-index material having a length of $0.26\lambda$, as long as the design requirement of an overall length $\Lambda = \lambda/2$ is fulfilled. Also, the same effect could be achieved by using a duty cycle close to 50% in the outer sections and closer to 0% or 100% in the inner cavity section, e.g. cavity 140. While the 50% duty cycle example above is the simplest solution, if the duty cycle is modified such that the percentage of one of the high-index or low-index materials increases, the effect is to reduce the grating strength. Such a reduction in the grating strength can be significant for duty cycles of 40/60 or 60/40 of high-index material to low-index material. These reductions in grating strength can be compensated for by elongating the gain portions, for example the non-grating portions 136-1.

As mentioned above, the lengths $L_{S1-j}$ are selected to minimize the existence of modes other than the fundamental mode, e.g. sufficiently short in length, the grating portions 138 acting to further detune those modes which are not in-phase with the fundamental mode. This results in narrow linewidth at the output wavelength $\lambda_0$ corresponding to the fundamental mode of the segmented grating 131. With the addition of the non-grating portions 136, 146 of the segmented portions 134, 144 providing additional gain over a significant length L of the segmented grating 131, a more consistent electric field over the length L of the segmented grating can be achieved as compared to conventional lasers, as depicted in FIG. 4.

It is noted that the lengths of the various structures, consistent with the present invention described herein, are typical for a structure designed on an InP substrate with a design lasing wavelength of around 1550 nm. The inventive concepts of the present invention can be applied to other wavelengths, such as 1300 nm for example, as well as other material systems and/or wavelengths, such as those built upon GaAs substrates designed for 850 nm or 980 nm for example.

Figure 4:
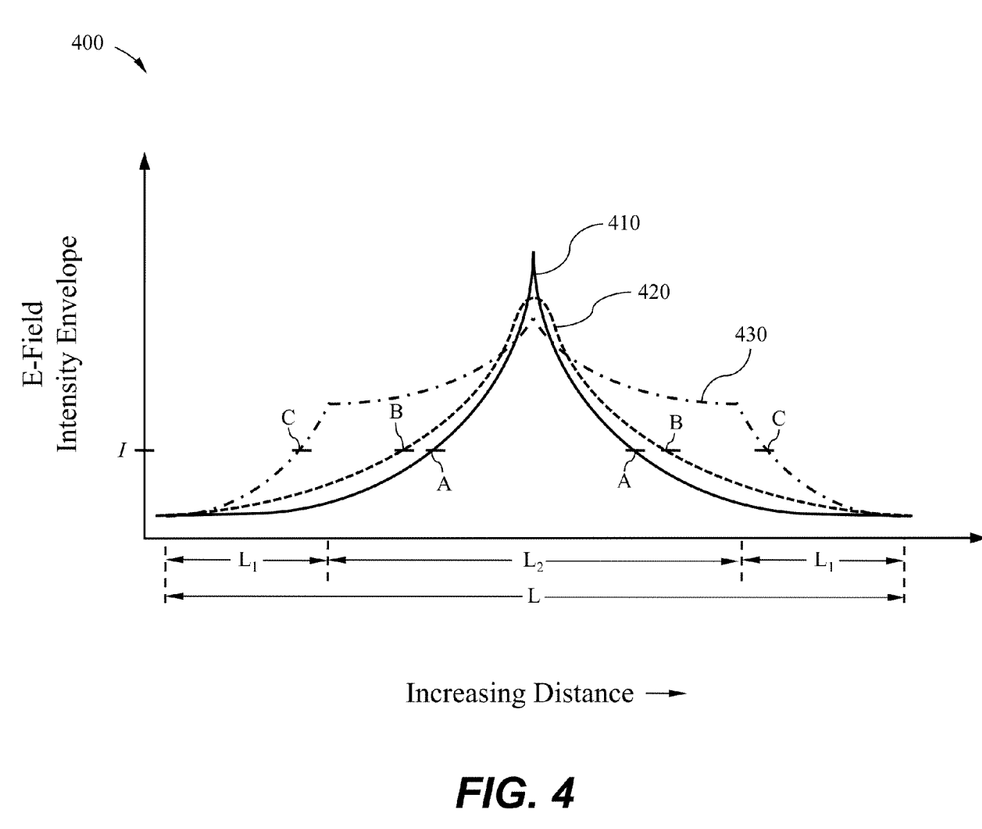
FIG. 4 is a detailed depiction of a second portion of the semiconductor laser of FIG. 1.

In particular, FIG. 4 depicts a graph 400 representation of the intensity of the electric field or e-field over a fixed length L of a segmented grating 131, consistent with this disclosure, as compared to exemplary e-field curves corresponding to conventional DFB and DBR lasers. More specifically, curve 410 depicts an exemplary e-field over the length of a conventional DFB laser, the strongest e-field observed at the wavelength $\lambda_0$ corresponding to the fundamental mode of the DFB laser. As is well know, a cavity enclosed by grating end portions at the ends of the grating structure, each having a length similar to the length $L_1$ of grating portion 132A for example, can be provided to transform the DFB laser into a DBR laser, the cavity having a length $L_2$. While the strongest e-field intensity is observed at the wavelength $\lambda_0$, as depicted by curve 420, the exemplary e-field is only marginally more uniform along a small portion of the overall length L of the laser, as compared to the exemplary e-field curve 410 of a conventional DFB laser. Utilizing a segmented grating 131 structure consistent with this disclosure results in a more uniform e-field over the length L of the laser, laser 100 for example, as depicted by curve 430, resulting in a stronger output at the fundamental mode of the laser 100, as well as a narrow linewidth. Segmented grating 131 also allows for an increased effective length of the laser 100. For example, with I representing a point where approximately half of the e-field is positioned above the corresponding line I and half of the e-field is positioned below the line I, the effective length of a conventional DFB laser is approximated by the distance between points A. Similarly, the effective length of a corresponding conventional DBR laser is approximated by the distance between points B, and an effective length of a laser incorporating segmented grating 131, for example laser 100, is approximated by the distance between points C.

Figure 5:
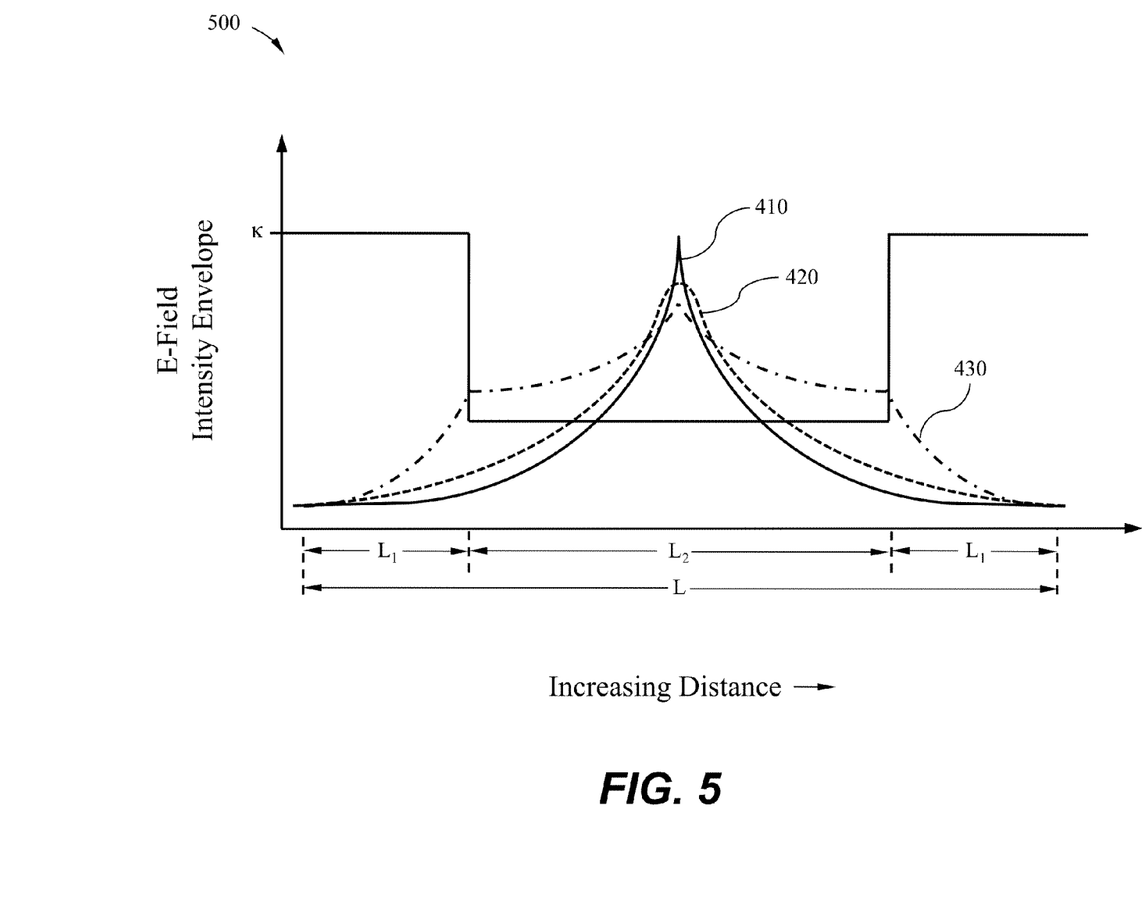
FIG. 5 is a graph depicting the reflection spectrum of the segmented grating of the semiconductor laser of FIG. 1.

Turning now to FIG. 5, a coupling coefficient κ corresponding to the segmented grating 131 and the e-field exemplary curve 430 is superimposed over the e-field plots similar to those of FIG. 4. More specifically, as depicted, the coupling coefficient κ has a first value corresponding to grating portions 132A, 132B of segmented grating 131 and then takes on a reduced value averaged over the central portion of segmented grating 131. Since the grating portions 132A, 132B, located at the ends of the segmented grating 131, have higher coupling coefficient values the corresponding exemplary e-field curve shows an increase in e-field over the length $L_1$ of the grating portions 132A, 132A. The segmented grating portions 134, 144, including corresponding non-grating portions 136, 146, have a reduced coupling coefficient such that the average coupling coefficient over the length $L_2$ of the central portion of segmented grating 131 produces an e-field curve having a lower rate of change, as depicted. As compared to conventional lasers, a DFB laser, since the grating is constant over the length L of the laser, would have a constant coupling coefficient over the entire length L of the laser, including the length $L_2$ of the central portion. Alternatively, a DBR laser would have a very low coupling coefficient in the central portion, as compared to the segmented grating 131 of the present invention.

Figure 6:
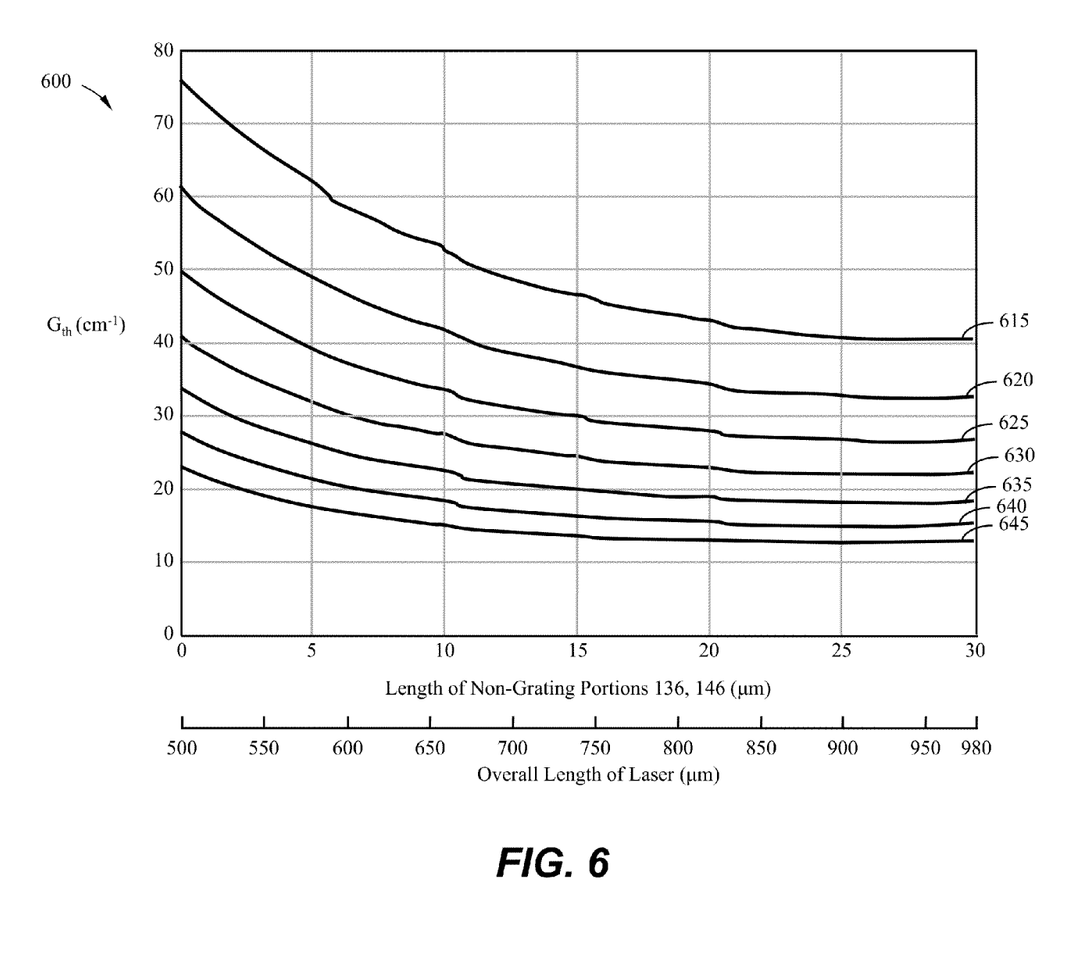
FIG. 6 is an exemplary electric field profile of the semiconductor laser of FIG. 1.
Figure 7:
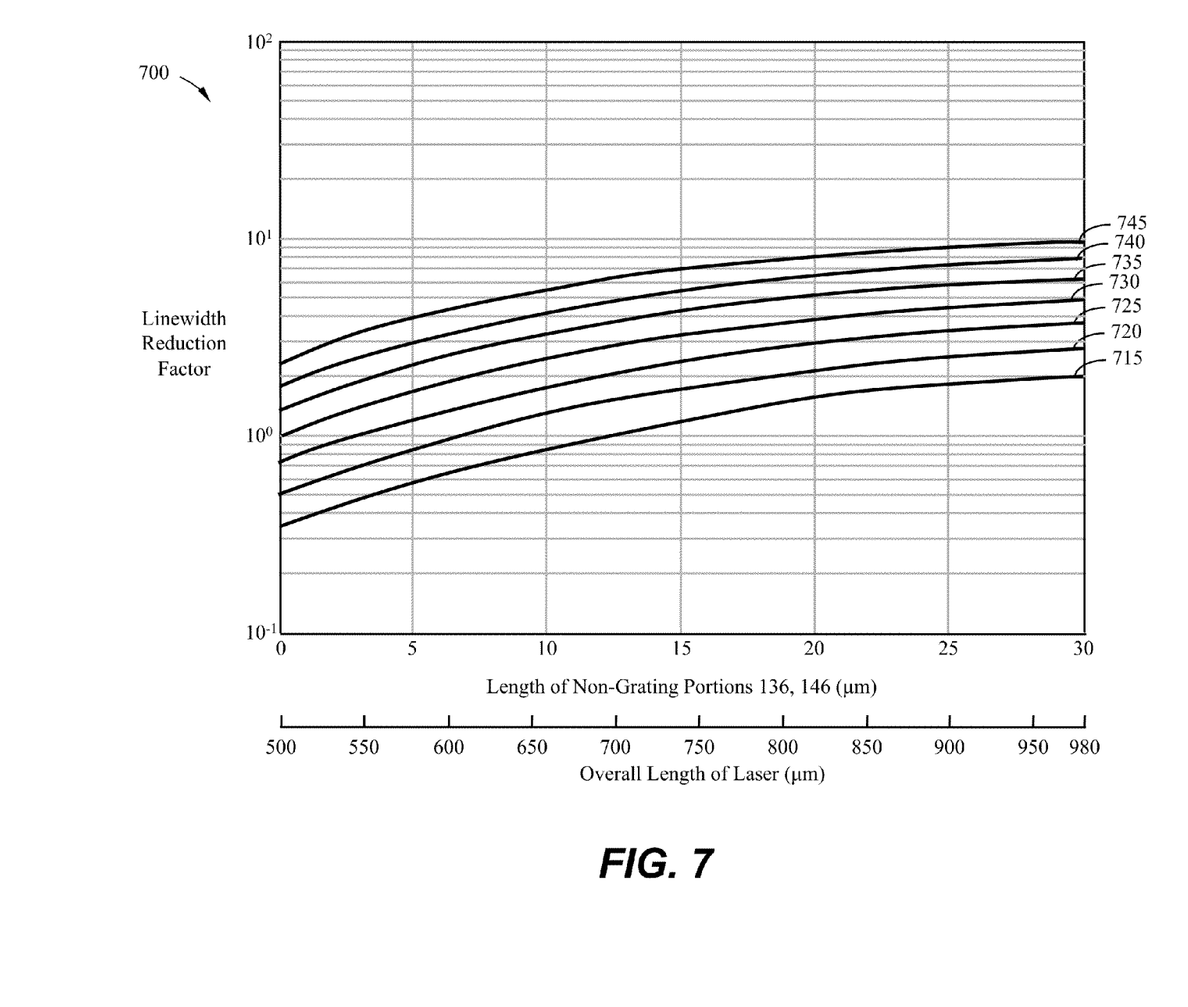
FIG. 7 is a photonic integrated circuit including a plurality of signal channels, each incorporating a semiconductor laser according to certain aspects of the present invention.

Now turning to FIGS. 6 and 7, results of a first simulation of a laser having a segmented grating 131 structure is depicted. With specific reference to FIG. 6, the simulated segmented grating, for example segmented grating 131, is created with 16 total grating portions 132, 144, for example 8 grating portions 134 and 8 grating portions 144. The corresponding non-grating portions 136, 146 are equal in length. The ratio of the length of grating portions 138, 148 to the length of non-grating portions 136, 146 is maintained at 50%. The overall length of all the grating portions 132A, 132B, 138, 148 is maintained at 500 μm. Thus, as the block length increases, the overall length of the laser increases. A central cavity 140 is provided, the cavity 140 having a suitable length to maintain the in-phase nature of the segmented grating 131. The graph 600 depicts the gain threshold vs. the length of non-grating portions 134, 144, as well as overall length of the laser, while maintaining the overall coupling coefficient κ of the segmented grating 131 constant, e.g. the coupling coefficient averaged over the length of the segmented grating 131 is constant. Curves 615, 620, 625, 630, 635, 640, and 645 correspond to segmented gratings 131 having overall coupling coefficients of 15 cm$^{-1}$, 20 cm$^{-1}$, 25 cm$^{-1}$, 30 cm$^{-1}$, 35 cm$^{-1}$, 40 cm$^{-1}$, 45 cm$^{-1}$, respectively. With respect to curve 630, for example, as the non-grating portion increases a corresponding decrease in the threshold is observed, consistent with a corresponding decrease in linewidth for example. As the non-grating portion increases from about 0 to about 20, the gain threshold decreases from about 40 to about 23.

Now turning to FIG. 7, a chart 700 depicts exemplary curves of a linewidth reduction factor vs. the length of non-grating portions 134, 144, as well as overall length of the laser, at a fixed current density, for the same segmented grating 131 structure defined above. Curves 715, 720, 725, 730, 735, 740, 745 correspond to segmented gratings 131 having overall coupling coefficients of 15 cm$^{-1}$, 20 cm$^{-1}$, 25 cm$^{-1}$, 30 cm$^{-1}$, 35 cm$^{-1}$, 40 cm$^{-1}$, 45 cm$^{-1}$, respectively. As depicted, as the length of the non-grating portions 136, 146 increases from about 0 μm to about 20 μm, the linewidth of the laser reduced by a factor of about 4 when the length of the non-grating portions are 20 μm.

Figure 8:
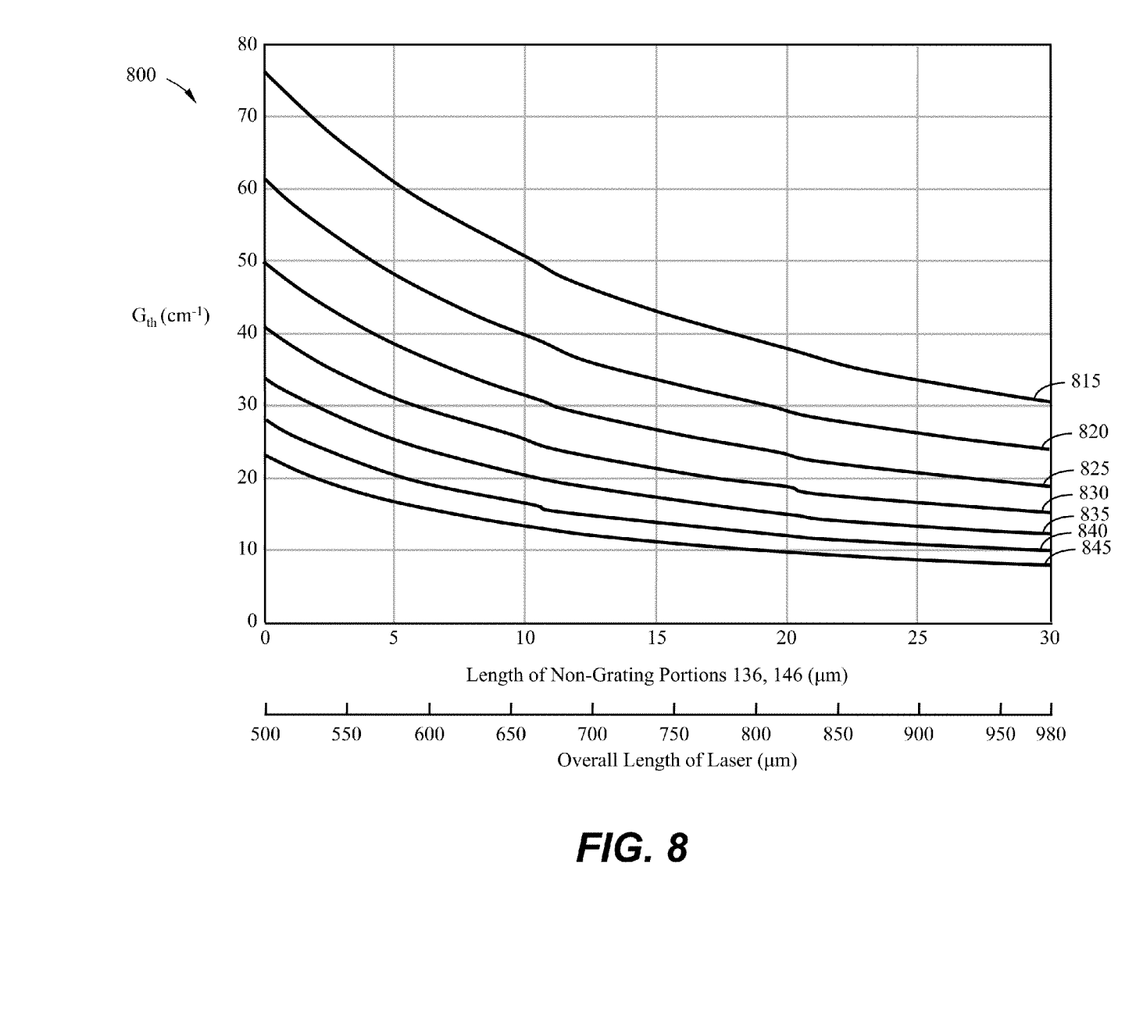
FIG. 8 shows simulated characteristics of a laser.
Figure 9:
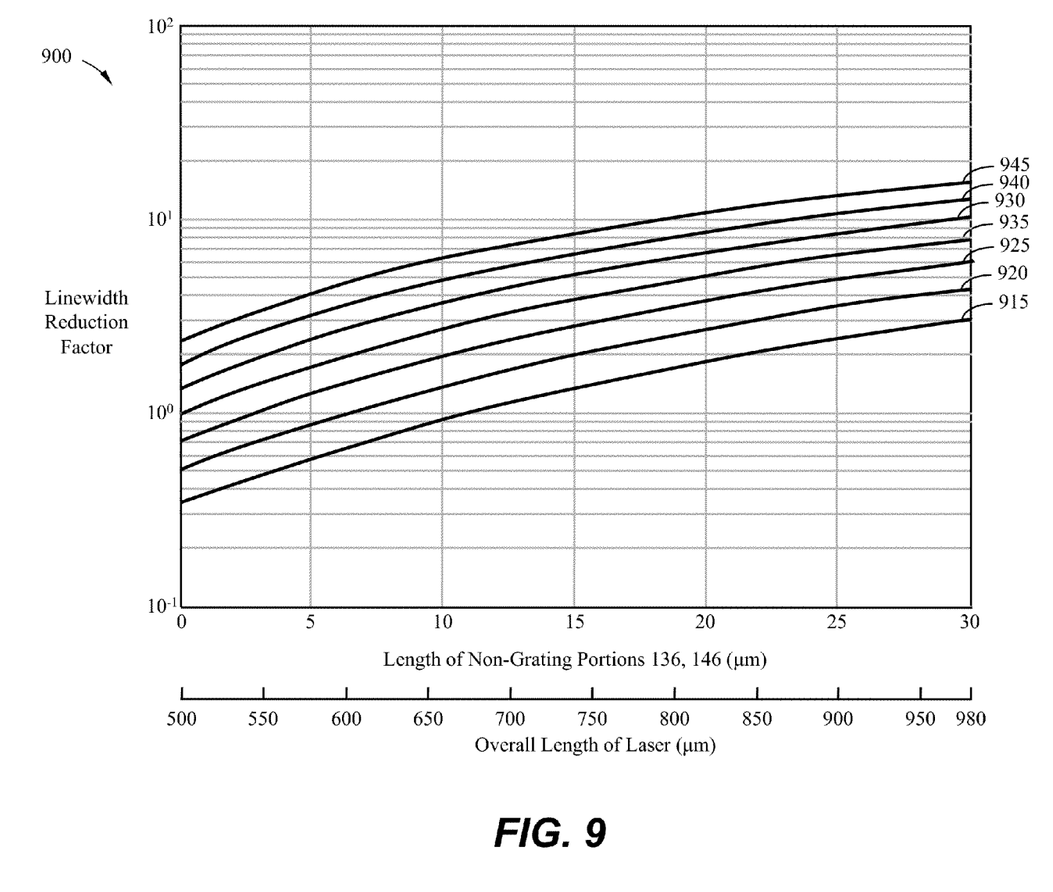
FIG. 9 shows further simulated characteristics of a laser.

Now turning to FIGS. 8 and 9, results of a second simulation of a laser having a segmented grating 131 structure is depicted. The segmented grating 1331 structure in the second simulation is similar to the structure of the first simulation, except the ratio of the length of grating portions 138, 148 to the length of non-grating portions 136, 146 is set to 20%. Curves 815, 820, 825, 830, 835, 840, and 845 correspond to segmented gratings 131 having overall coupling coefficients of 15 cm$^{-1}$, 20 cm$^{-1}$, 25 cm$^{-1}$, 30 cm$^{-1}$, 35 cm$^{-1}$, 40 cm$^{-1}$, 45 cm$^{-1}$, respectively. With reference to curve 830, the reduction in the ratio of the length of grating portions 138, 148 to the length of non-grating portions 136, 146 from 50% to 20% resulting in further reduction of the gain threshold as the non-grating portions 136, 146 are increased from about 0 μm to about 25 µm. For example, the gain threshold at 25 µm for curve 830 being about 17 cm$^{-1}$ as compared to about 22 cm$^{-1}$ of curve 630.

Now turning to FIG. 9, a chart 900 depicts exemplary curves of a linewidth reduction factor vs. the length of non-grating portions 134, 144, as well as overall length of the laser, at a fixed current density, for the same segmented grating 131 structure defined above with respect to the second simulation. Curves 915, 920, 925, 930, 935, 940, 945 correspond to segmented gratings 131 having overall coupling coefficients of 15 cm$^{-1}$, 20 cm$^{-1}$, 25 cm$^{-1}$, 30 cm$^{-1}$, 35 cm$^{-1}$, 40 cm$^{-1}$, 45 cm$^{-1}$, respectively. As expected in light of the curve 830 and as depicted in curve 930, the linewidth reduction factor is improved with respect to the segmented grating 131 structure of the first simulation. The linewidth reduction factor increases along the curve 930 as the length of the non-grating portions 136, 146 increases from about 0 µm to about 20 µm, the linewidth of the laser reduced by a factor of about 5 when the non-grating portion have a length of about 20 µm.

Figure 10:
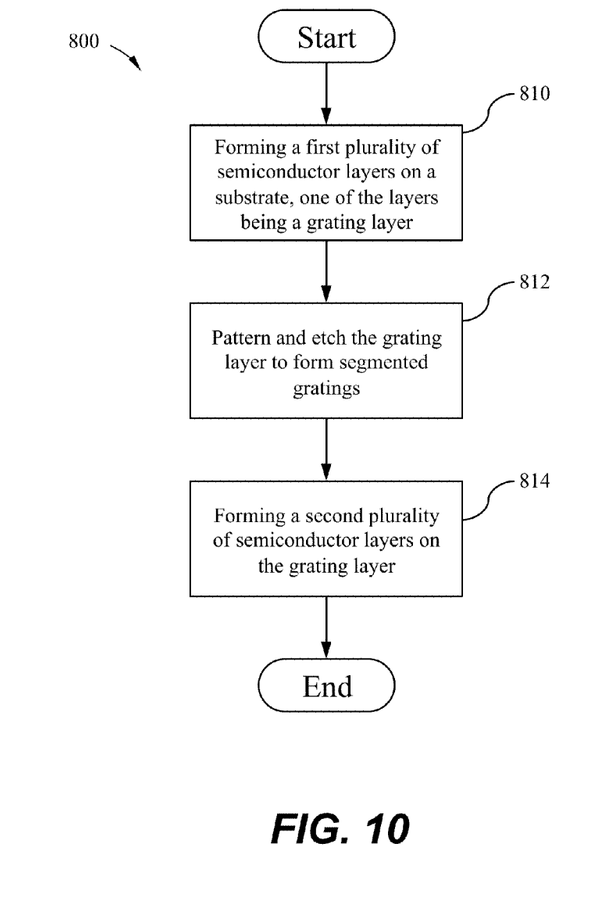
FIG. 10 illustrates steps of a method of fabricating a laser.

Now turning to FIG. 10, a method of fabrication of the laser 100, incorporating the segmented grating 131 consistent with the disclosure herein, will be discussed in greater detail. The laser 100 is preferably fabricated using metalorganic chemical vapour deposition (MOCVD) with an InP-based regime. In a first step 1010 a plurality of semiconductor layers, including the grating layer 130, is formed upon the substrate 110. As shown in FIG. 1, laser 100 comprises the substrate 110, which may be an InP substrate such as n-clad, referred to also as n-InP, or InP:Fe, followed by the first cladding layer 120 of n-InP or InP:Si, and then followed by the grating layer 130 comprised of InGaAsP ("PQ") or AlInGaAs ("AQ"), preferably PQ. This completes an initial MOCVD epitaxial growth step whereupon the segmented grating structures, as part of the grating layer 130, for laser 100 are formed, in a step 1012 of the exemplary method of FIG. 10.

The segmented grating structures are formed using conventional pattern techniques such as photolithography with dry or wet etching, utilizing a high-resolution stepper for example, e-beam writing, holographic beam writing, or nanoimprint technology to form the gratings with their proper grating pitch or period, Λ. For illustration purposes only, the grating period, Λ, may be about 0.24 µm for a corresponding operating wavelength of approximately 1545 nm. As is discussed in greater detail above with reference to FIGS. 2 and 3, the grating period, Λ, of the various segmented grating structures provides for operation at one of a plurality of wavelengths that correspond or approximate a wavelength along a standardized wavelength grid such as the ITU grid in the C band or L band, for example.

Once the grating layer 130 is patterned and etched, formation of a second plurality of semiconductor layers is performed in a step 1014. For example, the second cladding layer 150, such as for example, n-InP or InP:Si is formed over the grating layer 130. The epitaxial growth of layer 150 is followed by the growth of the active region or active layer 160 which may be comprised of multiple quantum wells and barriers employing a quaternary such as PQ or AQ, as is known in the art, preferably PQ. This is followed by the epitaxial growth of the third cladding layer 170 of InP p-clad, also referred to as p-InP, or InP:Zn, for example, as well as the contact layer 180 of p$^{++}$-InGaAs or InGaAs:Zn and the metallic contact 182. As mentioned above, the multiple layer structure of the laser 100 is for illustration purposes only. Additional embodiments, which would include the segmented grating structures of the grating layer of the present invention, may include semiconductor layers of materials differing from those above, or include additional semiconductor layers or other structures, all such additional embodiments being considered within the scope of the present invention. Additionally, the laser 100 structure may include additional metal or metallic contact surfaces which form heating elements, for example resistive heating elements (not shown), for tuning of the laser 100. For more information involving the fabrication of photonic integrated circuits incorporating additional multilayer structures and structures which allow for tuning of the laser device, see for example, U.S. Pat. Nos. 7,058,246; 7,079,715; 7,209,611; and 7,283,694, all incorporated herein by their reference in their entirety.

Figure 11:
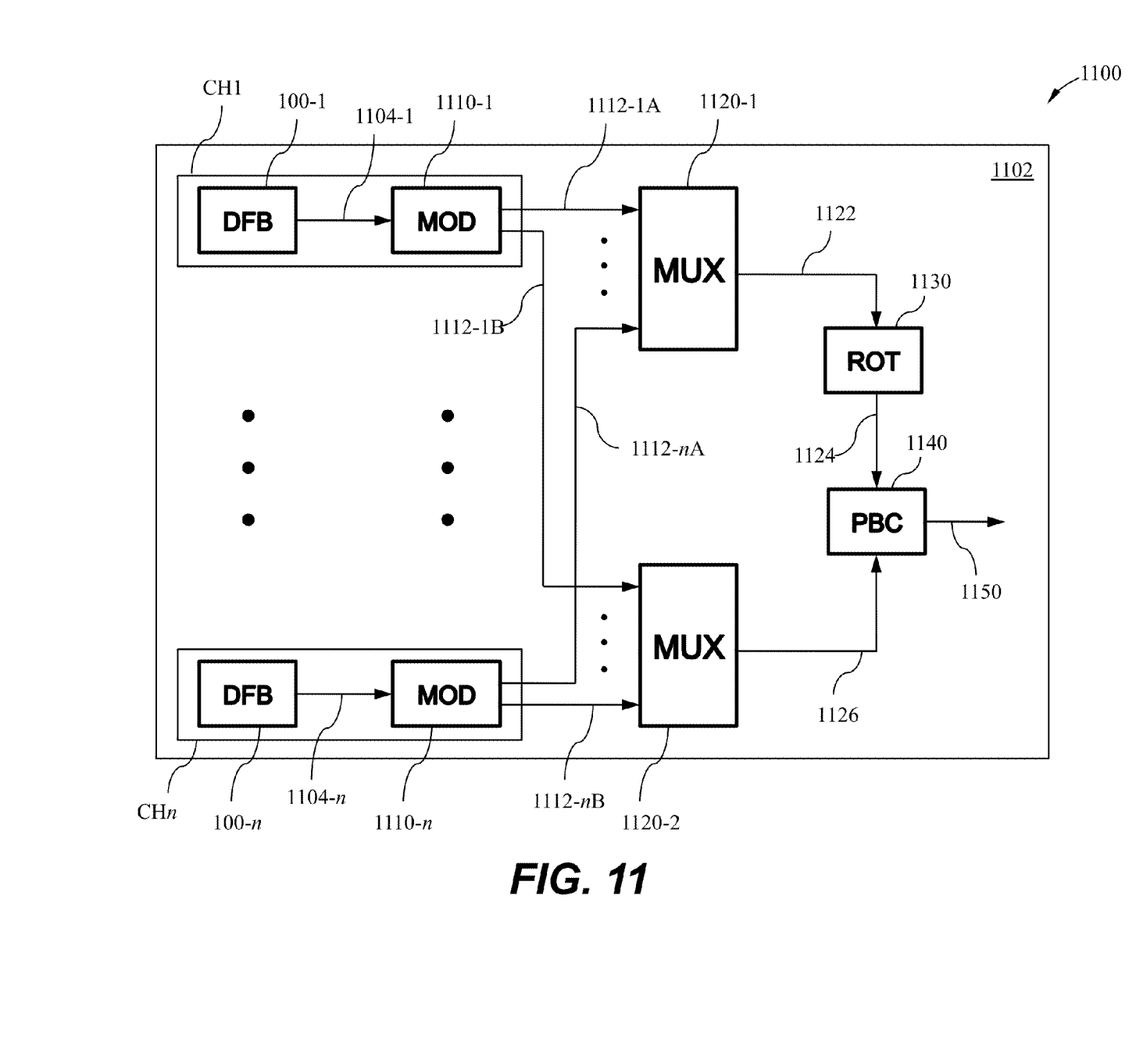
FIG. 11 illustrates a photonic integrated circuit.

Now turning to FIG. 11, a photonic integrated circuit 1100 including a plurality of semiconductor lasers 100 is depicted. The exemplary photonic integrated circuit 1100 of FIG. 11 incorporates a polarization multiplexer which takes advantage of the narrow linewidth achieved by the laser source 100 of the present invention. More specifically, FIG. 11 depicts photonic integrated circuit 1100 including a plurality of signal channels CH1 through CHn, collectively referred to as signal channels CH, provided on a single substrate. Each of the signal channels CH incorporates a semiconductor laser 100, according to the present invention, and a modulator 1110. For illustration purposes, the semiconductor laser 100-1 of CH1 provides a first optical output to the modulator 1110-1 via a waveguide 1104-1. As shown, the modulator provides first and second modulated outputs on first and second waveguides 1112-1A, 1112-1B, respectively. Each of the first and second modulated outputs have the same polarization, for example a transverse electric (TE) polarization, to form first TE modulated outputs and second TE modulated outputs. For more information regarding exemplary modulators 1110, see U.S. patent application Ser. No. 12/345,315, incorporated by reference herein in its entirety.

While only a laser 100-1 and modulator 1110-1 is present in signal channel CH1, signal channel CH1 may include additional electro-optic elements (not shown), both active and passive. Such electro-optic elements may include, but are not limited to, variable optical attenuators, semiconductor optical amplifiers, photodiodes, and optical couplers. Such electro-optic elements 710-1 may be used to vary the amplitude, or detect a characteristic of, the optical signal provided by the semiconductor laser 100-1, or provide other functions as contemplated in the discussion herein or the various publications incorporated by reference. A characteristic of the optical signal can be initially detected, for example, through the use of a photodiode, the detected optical signal characteristic being further processed as necessary to provide information related to, for illustration purposes only, optical signal power or wavelength. For example, such characteristics may be part of a feedback system which can be used to maintain the wavelength of the semiconductor laser 100-1 at a desired value. Additionally, each semiconductor laser 100 may utilize an individual heater (not shown) fabricated or positioned within thermal contact of the individual semiconductor laser, as part of the feedback system, to maintain the output wavelength at a desired value. More information regarding fabrication of such a photonic integrated circuit incorporating such heaters, as well as additional optical elements in each signal channel, can be found in U.S. Pat. Nos. 7,058,246; 7,079,715; 7,209,611; and 7,283,694, all of which have been incorporated by reference above.

As should be readily understood, each of the semiconductor lasers 100 may include corresponding segmented gratings, consistent with segmented grating 131 described herein, the various grating portions 132A, 132B, 138, 148 of each individual semiconductor laser 100 having a slightly different periodicity of $\Lambda_n$, n being the number of signal channels CH provided in the circuit 1100. Each different period, $\Lambda_n$, provides for a different operational wavelength which corresponds or approximates the wavelengths along a standardized wavelength grid such as the ITU grid in the C band or L band, for example.

The first TE modulated output of CH1 is provided to a first polarization multiplexer 1120-1 via waveguide 1112-1A and the second TE modulated output of CH1 is provided to a second polarization multiplexer 1120-2 via waveguide 1112-1B. The first polarization multiplexer combines each of the first TE modulated signals provided by each of the signal channels CH on waveguides 912-1A through 912-$n$A into a first TE multiplexed output provided to a polarization rotator 1130 via waveguide 1122. The polarization rotator 1130 rotates the polarization of the first TE multiplexed output to provide a corresponding first transverse magnetic (TM) multiplexed output which is provided to a first input of a polarization beam combiner 1140 via waveguide 1124. The second polarization multiplexer combines each of the second TE modulated signals provided by each of the signal channels CH on waveguides 912-1B through 912-$n$B into a second TE multiplexed output provided to a second input of the polarization beam combiner 940. The polarization beam combiner combines the first TE multiplexed output and the first TM multiplexed output to form a wavelength-division polarization multiplexed output for transmission from the photonic integrated circuit 1100 and over a network infrastructure.

While depicted with respect to a transmitter photonic integrated circuit 1100, the segmented grating 131 of the present invention can be utilized in other photonic integrated circuits. For example, certain coherent receivers can utilize laser sources 100 as local oscillators for demodulation of polarization multiplexed signals, such as PM DQPSK and PM DPSK. For more information regarding such coherent receivers see U.S. patent application Ser. No. 12/572,179, incorporated herein by reference in its entirety.

While the invention has been described in conjunction with several specific embodiments, it is evident to those skilled in the art that many further alternatives, modifications and variations will be apparent in light of the foregoing description. Thus, the invention described herein is intended to embrace all such alternatives, modifications, applications and variations as may fall within the spirit and scope of the appended claims.

What is claimed is:

1. A semiconductor laser, comprising:
   a substrate;
   a first cladding layer provided on the substrate;
   a grating layer provided on the substrate, the grating layer including:
   first and second gratings, the first grating extending to a first edge of the grating layer, and the second grating extending to a second edge of the grating layer; and
   first and second pluralities of segmented gratings, each including a non-grating portion and a grating portion, the first plurality of segmented gratings spaced from the second plurality of segmented gratings along a longitudinal axis of the grating layer to define a cavity, a length of the cavity being different than a length of each non-grating portion of each of the first and second pluralities of segmented gratings;
   a second cladding layer provided on the grating layer;
   an active layer provided on the second cladding layer;
   a third cladding layer provided on the active layer;
   a contact layer including semiconductor material provided on the third cladding layer; and
   a conductive layer provided on the contact layer.

2. The semiconductor laser of claim 1, wherein the active layer comprises InGaAsP or AlInGaAs.

3. The semiconductor laser of claim 1, wherein the first plurality of segmented gratings is a mirror image of the second plurality of segmented gratings along the longitudinal axis of the grating layer, such that the cavity is positioned at the center of the semiconductor laser.

4. The semiconductor laser of claim 1, wherein the length of each non-grating portion of the first and second pluralities of segmented gratings is substantially the same.

5. The semiconductor laser of claim 1, wherein the semiconductor laser provides an output optical signal having a wavelength, the length of the cavity being different from the length of each non-grating portion of each of the first and second pluralities of segmented gratings by about 0.25 times the wavelength of the output optical signal of the semiconductor laser.

6. The semiconductor laser of claim 1, further comprising a plurality of semiconductor layers provided on the active layer and a contact provided on the plurality of semiconductor layers for interfacing power to the semiconductor laser, the contact having a length which extends from a first end of the grating layer to a second end of the grating layer along a length of the grating layer.

7. A method of fabricating a semiconductor laser, comprising:
   forming a plurality of semiconductor layers on a substrate, a first one of the first plurality of semiconductor layers being a first cladding layer and a second one of the first plurality of semiconductor layer being a grating layer provided on the first cladding layer;
   forming first and second pluralities of segmented gratings in the grating layer, each of the first and second pluralities of segmented gratings including a non-grating portion and a grating portion, the first plurality of segmented gratings spaced from the second plurality of segmented gratings along a longitudinal axis of the grating layer to define a cavity, a length of the cavity being different than a length of each non-grating portion of each of the first and second pluralities of segmented gratings;
   forming first and second gratings in the grating layer, such that the first and second pluralities of segmented gratings are provided between the first and second gratings, the first grating extending to a first edge of the grating layer and the second grating extending to a second edge of the grating layer;
   forming a second cladding layer on the grating layer;
   forming an active layer on the second grating layer;
   forming a third cladding layer on the active layer;
   forming a contact layer on the third cladding layer; and
   forming a conductive layer on the contact layer.

* * * * *